United States Patent
Koen

[11] Patent Number: 6,118,340
[45] Date of Patent: Sep. 12, 2000

[54] LOW NOISE DIFFERENTIAL INPUT, DIFFERENTIAL OUTPUT AMPLIFIER AND METHOD

[75] Inventor: Myron J. Koen, Tucson, Ariz.

[73] Assignee: Burr-Brown Corporation, Tucson, Ariz.

[21] Appl. No.: 09/360,526

[22] Filed: Jul. 26, 1999

[51] Int. Cl.[7] .................................. H03F 3/45; H03F 1/36
[52] U.S. Cl. ........................... 330/253; 330/260; 330/85
[58] Field of Search ............................ 330/85, 253, 260, 330/252

[56] References Cited

U.S. PATENT DOCUMENTS

| | | | |
|---|---|---|---|
| 4,490,685 | 12/1984 | Sano | 330/252 |
| 4,536,717 | 8/1985 | Hauge et al. | 330/254 |
| 4,667,166 | 5/1987 | Itoh | 330/260 |
| 4,691,174 | 9/1987 | Nelson et al. | 330/260 |
| 4,736,166 | 4/1988 | Eckland et al. | 330/284 |
| 4,774,476 | 9/1988 | Ecklund et al. | 330/260 |
| 5,115,206 | 5/1992 | Mack et al. | 330/261 |
| 5,170,133 | 12/1992 | Pernici | 330/253 |
| 5,307,024 | 4/1994 | Metz et al. | 330/259 |
| 5,376,899 | 12/1994 | Pass | 330/253 |
| 5,384,501 | 1/1995 | Koyama et al. | 330/253 |
| 5,399,988 | 3/1995 | Knierim | 330/149 |
| 5,510,738 | 4/1996 | Gorecki et al. | 327/103 |
| 5,610,547 | 3/1997 | Koyama et al. | 330/260 |
| 5,774,019 | 6/1998 | Koyama et al. | 330/252 |

FOREIGN PATENT DOCUMENTS

| | | | |
|---|---|---|---|
| 61-173506 | 8/1986 | Japan | H03F 3/45 |
| 6-97744 | 4/1994 | Japan | H03F 3/45 |

*Primary Examiner*—Robert Pascal
*Assistant Examiner*—Patricia T. Nguyen
*Attorney, Agent, or Firm*—Cahill, Sutton & Thomas P.L.C.

[57] ABSTRACT

A low noise differential amplifier includes a differential stage and first and second unbalanced differential feedback amplifiers. The differential stage includes first (13) and second (14) load devices coupled to first (11) and second (12) conductors, respectively, a resistor (RS), a first input transistor (Q1) having a first electrode coupled to the first conductor and a second electrode coupled by a third conductor (16) to a first terminal of the resistor (RS), and a second input transistor (Q2) having a first electrode coupled to the second conductor (12) and a second electrode coupled by a fourth conductor (17) to a second terminal of the resistor (RS). The first feedback amplifier (18) includes a third input transistor (Q5) coupled between the third conductor (16) and the first current source transistor (Q3). The first feedback amplifier (18) drives the control electrode of the first input transistor (Q1). The second feedback amplifier (19) receives an input signal (VIN−), and drives to control electrode of the second input transistor (Q2), the second feedback amplifier (19) producing a second signal (25) on the control electrode of the second input transistor (Q2). A first current source produces a first bias current through the first load device (13), the first input transistor (Q1), and the third input transistor (Q5). A second current source produces a second bias current flowing through the second load device (14), the second input transistor (Q2), and the second feedback amplifier.

18 Claims, 3 Drawing Sheets

LOW NOISE DIFFERENTIAL INPUT, DIFFERENTIAL OUTPUT AMPLIFIER AND METHOD

BACKGROUND OF THE INVENTION

The invention relates to low noise amplifiers, and more particularly to circuitry and techniques for increasing the linearity and reducing distortion in low noise amplifiers without excessively increasing circuit complexity and/or power dissipation therein.

By way of background, resistance in series with the source electrodes of a pair of differentially coupled MOSFETs is the main source of noise in a differential amplifier. The prior art circuit shown in FIG. 1 illustrates a very low noise differential amplifier. The reason that its noise is low is that there is no resistor connected between the source electrodes of MOS field effect transistors (MOSFETs) Q1 and Q2. The gain of this amplifier is given by the expression $G=g_m R_L$, where $g_m$ is the transconductance of the pair of differentially connected input MOSFETs Q1 and Q2, and is very non-linear. Unfortunately, since this low noise circuit is very non-linear it introduces a great deal of distortion as it amplifies the differential input signal to produce a differential output signal.

FIG. 2 shows a prior art solution to the distortion of the circuit in FIG. 1. That solution is to connect a gain-setting resistor 15 of resistance $R_S$ between the source electrodes of the input MOSFETs Q1 and Q2. Constant current source MOSFETs Q3 and Q4 replace the single constant current source MOSFET Q3 in the circuit of FIG. 1. The gain of the circuit of FIG. 2 is given by the expression $G=g_m R_L/(1+g_m R_S)$, which simplifies to $G \approx R_L/R_S$ if $R_S$ is made large. Unfortunately, the solution of FIG. 2 to the distortion problem of the circuit of FIG. 1 greatly increases the noise. (Those skilled in the art know that a random noise voltage e is produced in a resistor of resistance R; e is equal to the square root of 4kTBR, where k is Boltzmann's constant, T is the temperature in degrees Kelvin, and B is the bandwidth of the circuit including the resistor.

FIG. 3 shows a prior art solution to both the distortion problem of the circuit of FIG. 1 and the noise problem of the circuit of FIG. 2. The solution is to add two feedback operational amplifiers 18 and 19 as shown. The gain of the circuit of FIG. 3 is given by the expression $G \approx A \cdot R_L/(A+1) \cdot R_S$, which simplifies to $G \approx R_L/R_S$ for a large value of the gain A of the operational amplifiers 18 and 19. This in effect allows the resistance $R_S$ of the gain setting resistor 15 to be divided by roughly the gain A of the operational amplifiers 18 and 19. Therefore $R_S$ can be small enough that both low noise operation and low distortion operation are achieved. However, this is achieved at the expense of (1) additional conventional operational amplifier circuitry that is required to implement the two operational amplifiers 18 and 19, and (2) substantial additional power dissipation in the two operational amplifiers.

In the past, the input impedance of differential input, differential output amplifiers has been reduced by their feedback circuitry. This has made it necessary to introduce additional high impedance input buffers between the input signals and the input terminals of the basic differential amplifier stages.

It would be desirable to provide a low power, low distortion differential amplifier that dissipates less power than has been achieved by the prior art. It also would be desirable to provide such a low power, low noise, low distortion differential amplifier having very high input impedance and differential outputs without use of feedback circuitry of a kind that reduces the input impedance.

SUMMARY OF THE INVENTION

Accordingly, it is an object of the invention to provide a low noise, low distortion differential amplifier with less complex circuitry than has been achieved in the prior art.

It is another object of the invention to provide a low noise, low distortion differential amplifier that dissipates less power than has been the case with the closest prior art low noise, low distortion differential amplifiers.

It is another object of the invention to provide a differential amplifier that provides low noise, low distortion operation when a large differential input signal is applied and/or the gain of the differential amplifier has been set to a high value.

It is another object of the invention to provide a low noise, low distortion, low power, low cost differential amplifier with differential outputs and having very high input impedance that is unaffected by feedback circuitry.

Briefly described, and in accordance with one embodiment thereof, the invention provides a low noise differential amplifier (FIG. 5) including a differential stage (10B) and first and second unbalanced differential feedback amplifiers. The differential stage includes first (13) and second (14) load devices coupled between a first reference voltage (VDD) and first (11) and second (12) conductors, respectively, a resistor (RS), a first input transistor (Q1) having a first electrode coupled to the first conductor and a second electrode coupled by a third conductor (16) to a first terminal of the resistor (RS), a second input transistor (Q2) having a first electrode coupled to the second conductor (12) and a second electrode coupled by a fourth conductor (17) to a second terminal of the resistor (RS), a first current source transistor (Q3) coupled to provide a first bias current, and a second current source transistor (Q4) coupled to provide a second bias current. The first feedback amplifier (18) includes a third input transistor (Q5) coupled between the third conductor (16) and the first current source transistor (Q3) and having a gate electrode coupled to receive a first input signal (VIN+), the first feedback amplifier (18) producing a first signal (24) on the control electrode of the first input transistor (Q1). The first bias current flows through the first load device (13), the first input transistor (Q1), the third input transistor (Q5), and the first current source transistor (Q3). The second feedback amplifier (19) includes a fourth input transistor (Q7) coupled between the fourth conductor (17) and the second current source transistor (Q4) and having a gate electrode coupled to receive a second input signal (VIN−), the second feedback amplifier (19) producing a second signal (25) on the control electrode of the second input transistor (Q2). The second bias current flows through the second load device (14), the second input transistor (Q2), the fourth input transistor (Q7), and the second current source transistor (Q4). In one described embodiment, the first feedback amplifier (18) includes a first stage including the third input transistor (Q5) as an input transistor and the first current source transistor (Q3) as a load device, and the second feedback amplifier (19) includes a first stage including the fourth input transistor (Q7) as an input transistor and the second current source transistor (Q4) as a load device. The first feedback amplifier (18) also includes a second stage including a fifth input transistor (Q9) and a third load device (Q10), and the second feedback amplifier (19) includes a second stage including a sixth input transistor (Q11) and a fourth load device (Q12). In one embodiment (FIG. 6), a first transconductance amplifier (32,36) is provided, with a first input coupled to the first conductor (11) and a second input coupled to a reference voltage (VREF). The first transconductance amplifier produces a first output signal (VOUT+), a second transconductance amplifier (33, 37) also is provided, with a first input coupled to the second conductor (12) and a second input coupled to a reference voltage (VREF). The second transconductance amplifier produces a second output signal (VOUT−).

Another low noise differential amplifier (FIG. 4) includes a differential stage (10A) including first (13) and second (14) load devices coupled between a first reference voltage (VDD) and first (11) and second (12) conductors, respectively, a resistor (RS), a first input transistor (Q1) having a first electrode coupled to the first conductor and a second electrode coupled by a third conductor (16) to a first terminal of the resistor (RS), and a second input transistor (Q2) having a first electrode coupled to the second conductor (12) and a second electrode coupled by a fourth conductor (17) to a second terminal of the resistor (RS), a first current source transistor (Q3) coupled to provide a first bias current through the first input transistor (Q1), and a second current source transistor (Q4) coupled to provide a second bias current through the second input transistor (Q2). A first unbalanced differential feedback amplifier (18) includes a third input transistor (Q5) coupled to the third conductor (16) and having a gate electrode coupled to receive a first input signal (VIN+). The first feedback amplifier (18) produces a first signal (24) on the control electrode of the first input transistor (Q1). A second unbalanced differential feedback amplifier (19) includes a fourth input transistor (Q7) coupled to the fourth conductor (17) and having a gate electrode coupled to receive a second input signal (VIN−). The second feedback amplifier (19) produces a second signal (25) on the control electrode of the second input transistor (Q2).

DETAILED DESCRIPTION OF THE PREFERRED EMBODIMENTS

By way of definition, the term "balanced differential amplifier" as used herein refers to a differential amplifier having a pair of differentially coupled input transistors with, for example, common source, common emitter, common base, or common gate electrode connections. The differential input signal has a common mode component that is common to both the (+) and (−) inputs of the differential amplifier. The term "differential" amplifier as used herein means "balanced differential amplifier". A single-stage amplifier with a single input transistor with, for example, a source electrode coupled to one input, a gate electrode coupled to another input, and a drain electrode coupled to a load circuit is referred to herein as an "unbalanced differential" amplifier, and does not have a common mode component in its differential input signal.

Figure 4:
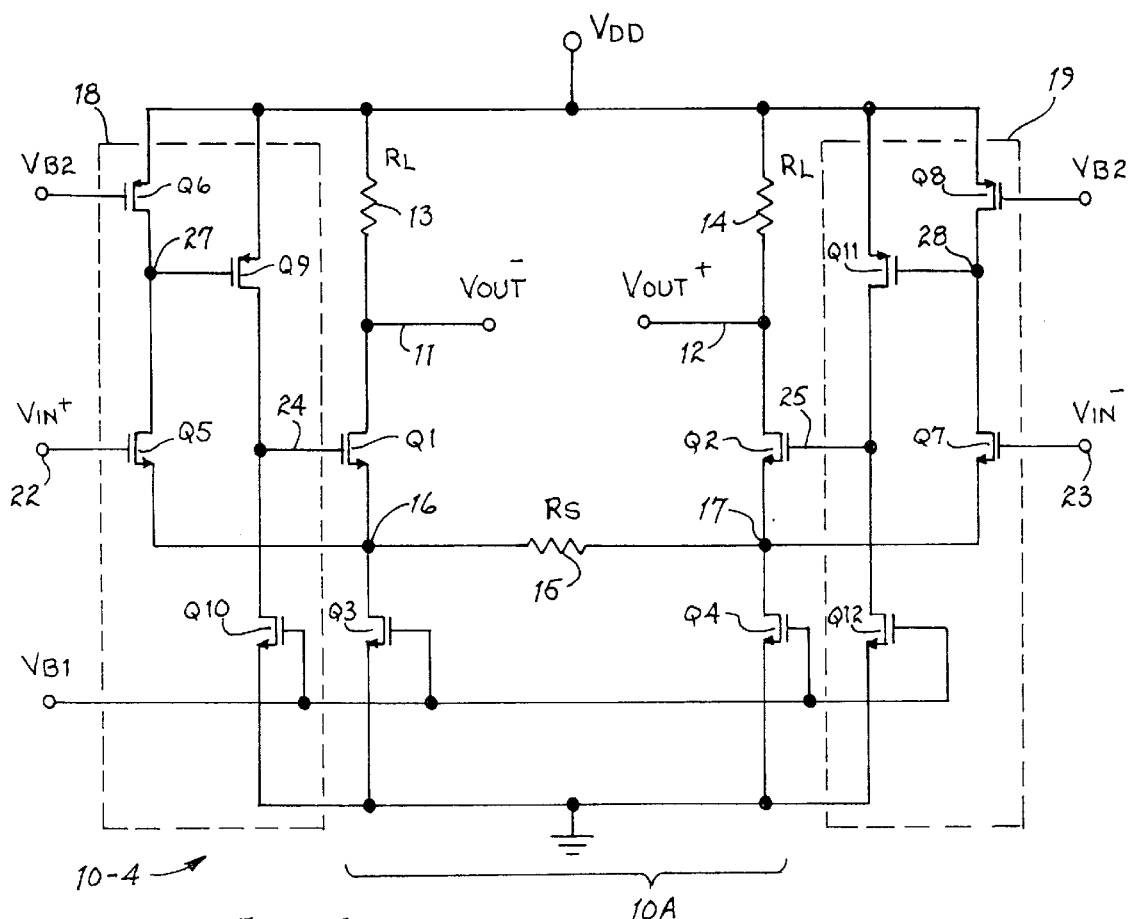
FIG. 4 is a circuit diagram of one embodiment of the invention.

Referring to FIG. 4, differential amplifier 10-4 includes a differential stage 10A and single ended feedback amplifiers 18 and 19. Differential stage 10A includes load resistors 13 and 14, each of resistance $R_L$, connected between $V_{DD}$ and output conductors 11 and 12, respectively. Differential stage 10A also includes N-channel input MOSFETs Q1 and Q2, gain-setting resistor 15, and N-channel current source MOSFETs Q3 and Q4. MOSFET Q1 has its drain connected to output conductor 11 and its source connected by conductor 16 to one terminal of resistor 15 and to the drain of current source MOSFET Q3, the source of which is connected to ground. Input MOSFET Q2 of differential stage 10A has its drain connected to output conductor 12 and its source connected by conductor 17 to the other terminal of resistor 15 and to the drain of current source MOSFET Q4, the source of which is connected to ground. Constant current source MOSFET Q3 provides a bias current flowing through load resistor 13 and transistor Q1, and current source MOSFET Q4 provides a bias current through load resistor R14 and transistor Q2. $V_{OUT}^+$ and $V_{OUT}^-$ are produced on output conductors 12 and 11, respectively.

Feedback amplifiers 18 and 19 in FIG. 4 are shown within dotted lines. $V_{IN}^+$ is applied by input conductor 22 to the gate of an N-channel MOSFET Q5 having its source connected to conductor 16 and its drain connected by conductor 27 to the gate of the P-channel MOSFET Q9 and the drain of a P-channel MOSFET load Q6, which has its source connected to $V_{DD}$. The gate of load MOSFET Q6 is connected to a bias voltage $V_{B2}$. The drain of MOSFET Q9 is connected by conductor 24 to the gate of input MOSFET Q1 of differential stage 10A and to the drain of an N-channel MOSFET Q10, the source of which is connected to ground.

MOSFETs Q5 and Q6 function as a first stage of feedback amplifier 18 and MOSFETs Q9 and Q10 function as a second stage thereof. Conductor 16 provides feedback from the source of input MOSFET Q1 of differential stage 10A to the source of input MOSFET Q5 of feedback amplifier 18.

Similarly, feedback amplifier 19 includes N-channel MOSFET Q7 and P-channel MOSFET Q8 which form a first stage that drives a second stage including P-channel MOSFET Q11 and N-channel MOSFET Q12. The output of feedback amplifier 19 is applied by conductor 25 to the gate of differential stage input MOSFET Q2 of differential stage 10A. Feedback is provided by conductor 17 from the source of input MOSFET Q2 of differential stage 10A to the source of input MOSFET Q7 of feedback amplifier 19. A second bias voltage $V_{B1}$ is applied to the gates of MOSFETs Q3, Q4, Q10, and Q12, all of which function as constant current sources.

The circuit of FIG. 4 accomplishes feedback needed to divide the effective resistance $R_S$ of gain-setting resistor 15 by the gain of the feedback amplifiers 18 and 19 using a simple, relatively low power unbalanced differential feedback amplifier circuit for each of feedback amplifiers 18 and 19, rather than conventional differential operational amplifiers which are much more complex and power-consuming.

However, in order for the circuit shown in FIG. 4 to achieve low noise performance, it is necessary that input MOSFETs Q5 and Q7 operate at high current levels. This is because the $g_m$ of each of these input MOSFETs Q5 and Q7 can be modeled as a resistor connected in series with the source electrode of an "ideal" MOSFET having zero source resistance. The modeled resistor value is equal to $1/g_m$, where $g_m$ is equal to a constant K multiplied by the square root of the bias current I flowing through the MOSFET. Thus, $g_m$ has the effect of producing the same noise as a resistor of resistance $2/(3g_m)$. Therefore, the higher the bias currents of MOSFETs Q5 and Q7, the higher their $g_m$ values, therefore the lower the values of the resistors in the foregoing noise model, and hence the lower the noise produced therein.

Figure 1:
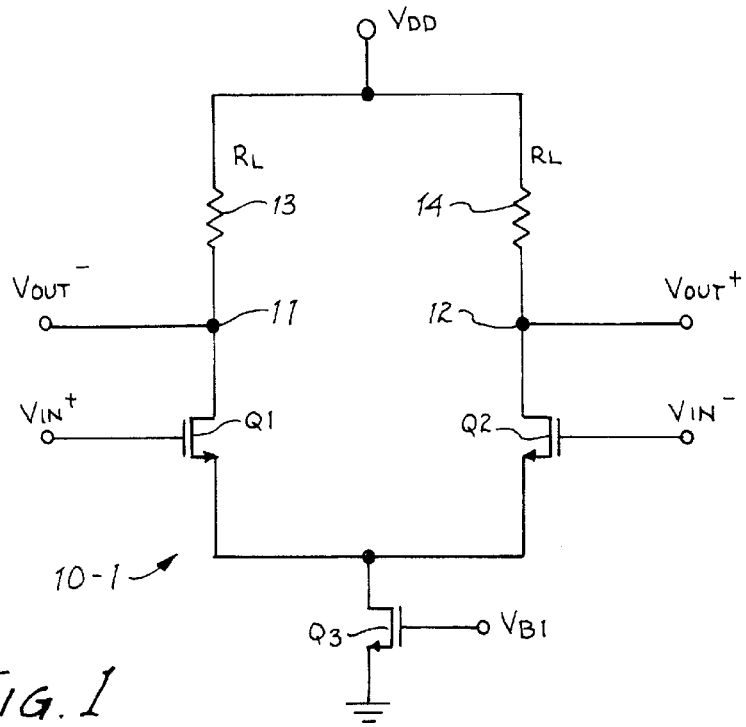
FIG. 1 is a diagram of a prior art low noise differential amplifier.
Figure 2:
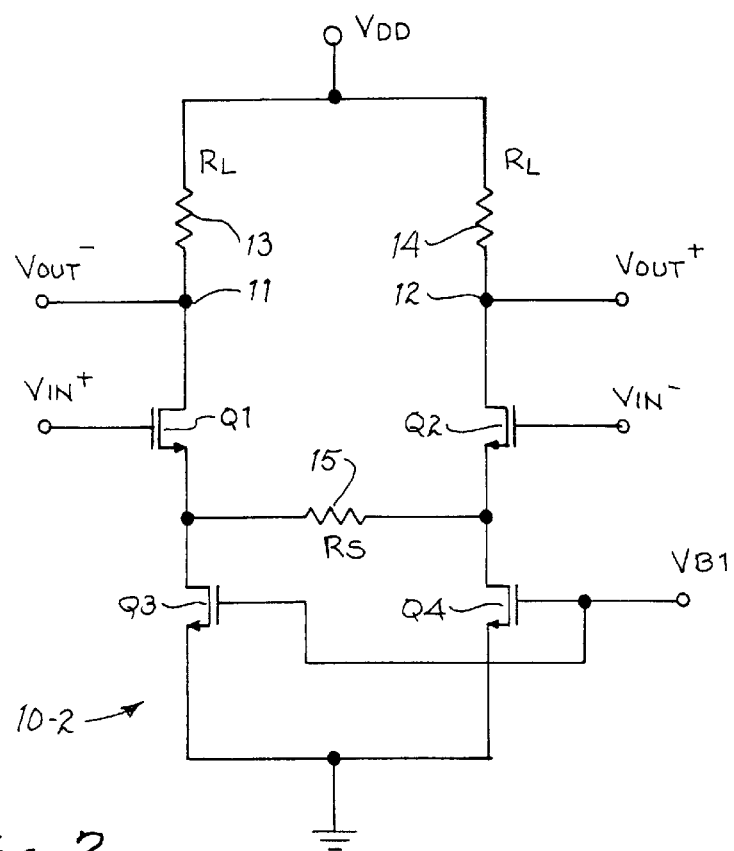
FIG. 2 is a diagram of another prior art differential amplifier.
Figure 3:
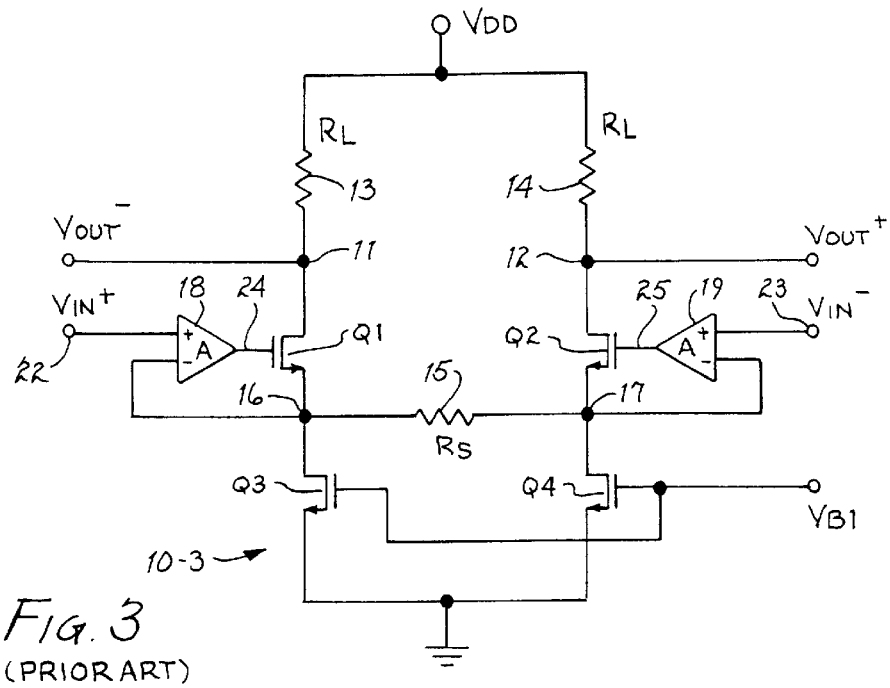
FIG. 3 is a diagram of a prior art differential amplifier utilizing operational amplifiers to provide feedback to reduce noise and distortion.

Also, to achieve good linearity $g_m$ must be large so the previously mentioned linear equation for the circuit of FIG. 3 is applicable.

Figure 5:
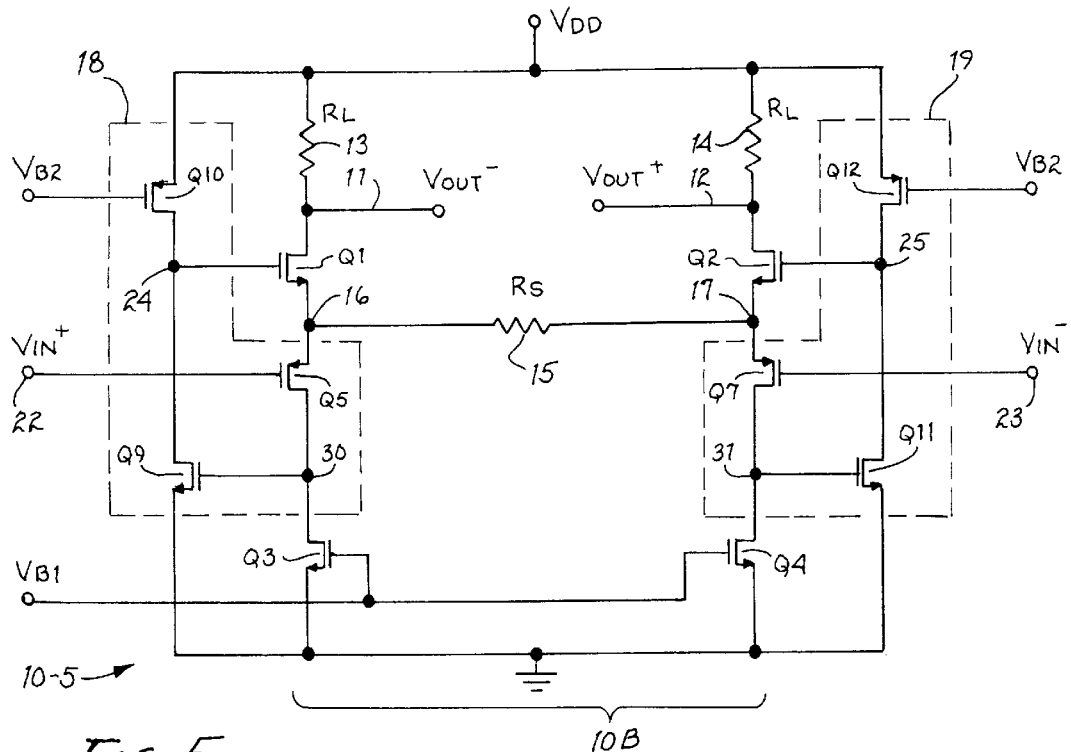
FIG. 5 is a schematic diagram of a preferred embodiment of the invention.

Referring next to FIG. 5, low noise differential amplifier 10-5 includes unbalanced differential feedback amplifiers 18 and is 19 and a differential stage 10B which includes load resistors 13 and 14, N-channel input MOSFETs Q1 and Q2, gain setting resistor 15, and N-channel current source MOSFETs Q3 and Q4. Load resistors 13 and 14 are connected by output conductors 11 and 12 to the drain of input MOSFETs Q1 and Q2, respectively. Resistor 15 of resistance $R_S$ is connected between the sources of MOSFETs Q1 and Q2. The gates of MOSFETs Q1 and Q2 are connected to the outputs 24 and 25 of unbalanced differential feedback amplifiers 18 and 19, respectively. Current source MOSFETs Q3 and Q4 in FIG. 5 have their drain electrodes coupled by P-channel MOSFETs Q5 and Q7 and conductors 16 and 17 to the sources of input MOSFETs Q1 and Q2, respectively.

MOSFET Q5 is an input transistor for a first stage of unbalanced differential feedback amplifier 18. The first stage of unbalanced differential feedback amplifier 18 uses current source MOSFET Q3 of differential stage 10B as a load device, and produces an output signal on conductor 30 to drive a second stage of unbalanced differential feedback amplifier 18 that includes N-channel MOSFET Q9 as an input transistor and P-channel MOSFET Q10 as a load device. The second stage of unbalanced differential feedback amplifier 18 produces the above mentioned output signal on conductor 24 to drive the gate of input MOSFET Q1 of differential stage 10B. Unbalanced differential feedback amplifier 18 is "referenced" to the voltage on conductor 16, which connects the source of N-channel input MOSFET Q1 of differential stage 10B to the source of the P-channel input MOSFET Q5 of feedback amplifier 18. The voltage on conductor 16 therefore acts as one input of unbalanced differential feedback amplifier 18, $V_{IN}^+$ being its other input.

Similarly, MOSFET Q7 is an input transistor for a first stage of unbalanced differential feedback amplifier 19. The first stage of unbalanced differential feedback amplifier 19 uses current source MOSFET Q4 of differential stage 10B as a load device, and produces an output signal on conductor 31 to drive a second stage of unbalanced differential feedback amplifier 19 that includes N-channel MOSFET Q11 as an input transistor and P-channel MOSFET Q12 as a load device. The second stage of unbalanced differential feedback amplifier 19 produces an output signal on conductor 25 to drive the gate of input MOSFET Q2 of differential stage 10B. Unbalanced differential feedback amplifier 19 is "referenced" to the voltage on conductor 17, which connects the source of N-channel input MOSFET Q2 of differential stage 10B to the source of P-channel input MOSFET Q7 of unbalanced differential feedback amplifier 19. The voltage on conductor 17 therefore is one input of unbalanced differential feedback amplifier 19, $V_{IN}^-$ being its other input. Note that there is no common mode input voltage associated with the "differential" inputs of either of unbalanced differential feedback amplifiers 18 or 19.

The circuit shown in FIG. 5 has an advantage over the circuits of prior art FIG. 3 and also over the differential amplifier 10-4 of FIG. 4 in that the bias current through the load resistor 13 and input MOSFET Q1 of differential stage 10B also flows through the input transistor Q5 of feedback amplifier 18; this also is true with respect to the bias current that flows through load resistor 14, input MOSFET Q2 and the input MOSFET Q7 of feedback amplifier 19. The high bias currents flowing through input transistors Q1 and Q2 of differential stage 10B to increase its $g_m$ are necessary to reduce thermal noise.

In the circuit shown in FIG. 4, high bias currents through the load resistors 13 and 14 and input transistors Q1 and Q2 are needed for the same reasons. In addition, two different high bias currents also are needed in the second stages of feedback amplifiers 18 and 19 of FIG. 4. The result is substantially higher power dissipation in the differential amplifier 10-4 of FIG. 4 than in the differential amplifier 10-5 of FIG. 5 to achieve comparable low distortion and low noise operation.

Thus, the circuit of FIG. 5 has the low noise and low distortion advantages of the circuit of FIGS. 3 and 4, but with far lower power dissipation.

Figure 6:
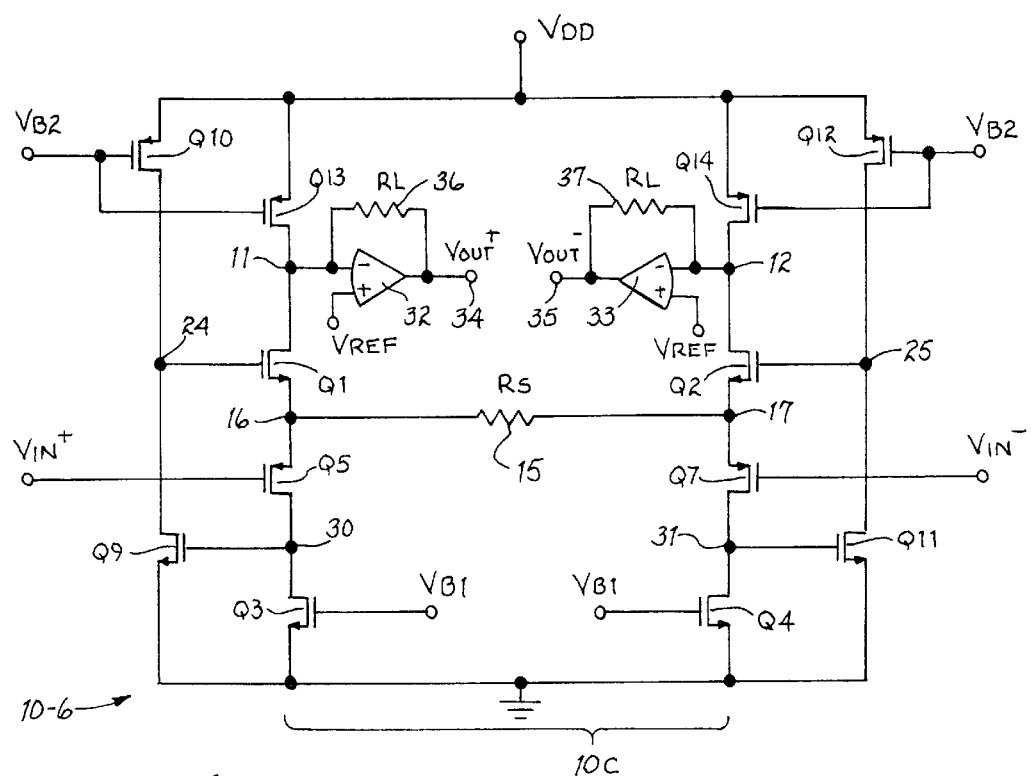
FIG. 6 is a schematic diagram of another preferred embodiment of the invention.

FIG. 6 shows an alternative low noise differential amplifier 10-6 of the present invention. Differential amplifier 10-6 differs from differential amplifier 10-5 of FIG. 5 in that load resistor 13 in differential stage 10C of FIG. 5 is replaced by a P-channel MOSFET Q13 having its source connected to $V_{DD}$, its drain connected to conductor 11, and its gate connected to bias voltage $V_{B2}$. Similarly, load resistor 14 of FIG. 5 is replaced by P-channel MOSFET Q14 coupled between $V_{DD}$ and conductor 12, and its gate connected to $V_{B2}$. Conductor 11 is connected to the (−) input of an operational amplifier 32 having its (+) input connected to $V_{REF}$. A feedback resistor 36 of resistance $R_L$ is connected between the output of operational amplifier 32 on conductor 34 and the (−) input thereof. Operational amplifier 32 and load resistor 36 thus constitute a transconductance amplifier which operates as a current-to-voltage converter to produce $V_{OUT}^+$ on conductor 34. Similarly, conductor 12 is connected to the (−) input of operational amplifier 33, which has its (+) input connected to $V_{REF}$ and its output connected by conductor 35 to feedback resistor 37 of resistance $R_L$ to the (−) input of operational amplifier 33. The output voltage $V_{OUT}^-$ is produced on conductor 35. $V_{REF}$ can be selected to provide a suitable large common mode input voltage range.

In the circuit of FIG. 6, the two transconductance amplifiers operate to maintain the voltages on conductors 11 and 12 at the voltage $V_{REF}$. This prevents input MOSFETs Q1 and Q2 of differential stage 10C from going into their non-linear operating regions, even for large values of the differential input voltage $V_{IN}^+ - V_{IN}^-$. Therefore, the differential amplifier of FIG. 6 may be advantageous over the one of FIG. 5 in cases in which the differential input signal range and/or the gain determined by the gain setting resistor 15 and the load resistors of resistance $R_L$ are large enough to cause the input MOSFETs Q1 and Q2 in FIG. 5 to go into their non-linear regions. The combined advantages of low noise operation and low distortion operation of FIG. 5 nevertheless are achieved.

While the invention has been described with reference to several particular embodiments thereof, those skilled in the art will be able to make the various modifications to the described embodiments of the invention without departing from the true spirit and scope of the invention. It is intended that all elements or steps which are insubstantially different or perform substantially the same function in substantially the same way to achieve the same result as what is claimed are within the scope of the invention. For example, a bipolar implementation of the circuit shown in FIG. 5 could be provided to achieve low noise, low distortion, low power operation with circuitry of relatively low complexity and low cost. As another example, in the embodiment of FIG. 5, the same relatively large bias current is used to accomplish biasing of each of input transistors Q1 and Q2 and also of the input transistors Q5 and Q7 of the corresponding unbalanced differential feedback amplifiers 17 and 18, so that the desired low noise operation is achieved with only approximately half of the power dissipation of the circuit of FIG. 4. Accordingly, the invention of FIG. 5 is intended to encompass other circuits in which a relatively large common bias current is shared between input transistors of multiple amplifier stages to achieve linear low noise operation with low power dissipation.

What is claimed is:

1. A low noise differential amplifier, comprising:
   (a) a differential stage including
      i. first and second load devices coupled between a first reference voltage and first and second conductors, respectively,
      ii. a resistor,
      iii. a first input transistor having a first electrode coupled to the first conductor and a second electrode coupled by a third conductor to a first terminal of the resistor, and a second input transistor having a first electrode coupled to the second conductor and a second electrode coupled by a fourth conductor to a second terminal of the resistor,
      iv. a first current source coupled to provide a first bias current, and a second current source coupled to provide a second bias current;
   (b) a first feedback amplifier including a third input transistor coupled between the third conductor and the first current source and having a gate electrode coupled to receive a first input signal, the first feedback amplifier producing a first signal on the control electrode of the first input transistor of the differential stage, the first bias current flowing through the first load device, the first input transistor, the third input transistor, and the first current source; and
   (c) a second feedback amplifier including a fourth input transistor coupled between the fourth conductor and the second current source and having a gate electrode coupled to receive a second input signal, the second feedback amplifier producing a second signal on the control electrode of the second input transistor, the second bias current flowing through the second load device, the second input transistor, the fourth input transistor, and the second current source.

2. The low noise differential amplifier of claim 1 wherein the first feedback amplifier includes a first stage including the third input transistor as an input transistor and the first current source transistor as a load device, and the second feedback amplifier includes a first stage including the fourth input transistor as an input transistor and the second current source transistor as a load device.

3. The low noise differential amplifier of claim 2 wherein the first feedback amplifier includes a second stage including a fifth input transistor and a third load device, and the second feedback amplifier includes a second stage including a sixth input transistor and a fourth load device.

4. The low noise differential amplifier of claim 3 wherein the first, second, third, and fourth input transistors are field effect transistors, and the first and second current source transistors are field effect transistors.

5. The low noise differential amplifier of claim 4 wherein the first and second input transistors are N-channel MOSFETs, the third and fourth input transistors are P-channel MOSFETs, and the first and second current sources are N-channel MOSFETs.

6. The low noise differential amplifier of claim 5 wherein the fifth and sixth input transistors are N-channel MOSFETs.

7. The low noise differential amplifier of claim 6 wherein the first and second load devices are resistors.

8. The low noise differential amplifier of claim 1 including a first transconductance amplifier having a first input coupled to the first conductor and a second input coupled to a reference voltage, the first transconductance amplifier producing a first output signal, and a second transconductance amplifier having a first input coupled to the second conductor and a second input coupled to a reference voltage, the second transconductance amplifier producing a second output signal.

9. The low noise differential amplifier of claim 8 wherein the first and second load devices are P-channel MOSFETs.

10. The low noise differential amplifier of claim 9 wherein the first and second input transistors are N-channel MOSFETs, the third and fourth input transistors are P-channel MOSFETs, and the first and second current sources are N-channel MOSFETs.

11. The low noise differential amplifier of claim 10 wherein the fifth and sixth input transistors are N-channel MOSFETs.

12. A low noise differential amplifier, comprising:
   (a) a differential stage including
      i. first and second load devices coupled between a first reference voltage and first and second conductors, respectively,
      ii. a resistor,
      iii. a first input transistor having a first electrode coupled to the first conductor and a second electrode coupled by a third conductor to a first terminal of the resistor, and a second input transistor having a first electrode coupled to the second conductor and a second electrode coupled by a fourth conductor to a second terminal of the resistor,
      iv. a first current source coupled to provide a first bias current through the first input transistor, and a second current source coupled to provide a second bias current through the second input transistor;
   (b) a first unbalanced differential feedback amplifier including a third input transistor coupled to the third conductor and having a gate electrode coupled to receive a first input signal, the first feedback amplifier producing a first signal on the control electrode of the first input transistor; and
   (c) a second unbalanced differential feedback amplifier including a fourth input transistor coupled to the fourth conductor and having a gate electrode coupled to receive a second input signal, the second feedback amplifier producing a second signal on the control electrode of the second input transistor.

13. The low noise differential amplifier of claim 12 wherein the first, second, third, and fourth input transistors are N-channel MOSFETs, the fifth and sixth input transistors are P-channel MOSFETs, and the first and second current sources are N-channel MOSFETs.

14. The low noise differential amplifier of claim 13 including first and second P-channel MOSFETs connected as load devices for the third and fourth input transistors, respectively, and first and second N-channel MOSFETs connected as load devices for the fifth and sixth input transistors, respectively.

15. A method of providing low noise and low distortion in a differential amplifier circuit receiving first and second input signals constituting a differential input signal, comprising:
- (a) providing a balanced differential amplifier stage including a first input transistor having a control electrode coupled to a first input and a second input transistor having a control electrode coupled to a second input, a first resistor coupled between a first electrode of each of the first and second input transistors, and first and second current sources coupled between a first supply voltage and the first electrodes of the first and second input transistors, respectively;
- (b) providing a first unbalanced differential feedback amplifier having a first signal input, a first feedback input, and a first output, and providing a second unbalanced differential feedback amplifier having a second signal input, a second feedback input, and a second output; and
- (c) amplifying the differential input signal by applying the first input signal to the first signal input, applying a first feedback signal from the first electrode of the first input transistor to the first feedback input, and applying a first resulting output signal on the first output to the first input, and applying a second feedback signal from the first electrode of the second input transistor to the second feedback input, and applying a second resulting output signal on the second output to the second input, to produce a low noise output signal with low distortion between a second electrode of the first input transistor and a second electrode of the second input transistor.

16. The method of claim 15 including:
providing a third input transistor in the first unbalanced differential feedback amplifier and a fourth input transistor in the second unbalanced differential feedback amplifier; and
causing a first bias current produced by the first current source to flow through both the third input transistor and the first input transistor, and causing a second bias current produced by the second current source to flow through both the fourth input transistor and the second input transistor,
step (c) including applying the first input signal to a control electrode of the third input transistor and applying the second input signal to a control electrode of the fourth input transistor,
the amplitudes of the first and second bias currents being sufficiently large to provide a noise level in the differential amplifier circuit below a predetermined level.

17. A method of providing low signal noise and low signal distortion in a circuit, comprising:
- (a) providing a first stage including a first input transistor and a first input, a control electrode of the first input transistor being coupled to the first input to receive a first input signal, the first stage producing a first output signal;
- (b) providing a second stage including a second input and a second input transistor having a control electrode coupled to receive the first output signal; and
- (c) producing a first bias current by means of a first current source and causing the first bias current to flow through both the first input transistor and the second input transistor, the amplitude of the first bias current being sufficiently large to produce a noise level below a predetermined level and a distortion level below a predetermined level.

18. A low noise, low distortion circuit comprising:
- (a) a first stage including a first input transistor and a first input, a control electrode of the first input transistor being coupled to the first input to receive a first input signal, the first stage producing a first output signal;
- (b) a second stage including a second input and a second input transistor having a control electrode coupled to receive the first output signal; and
- (c) a first current source producing a first bias current and circuitry coupled to the first bias current source, the first input transistor, and the second input transistor so as to cause the first bias current to flow through both the first input transistor and the second input transistor, the amplitude of the first bias current being sufficiently large to produce a noise level below a predetermined level and a distortion level below a predetermined level.

* * * * *